(12) United States Patent
Hung et al.

(10) Patent No.: US 6,329,292 B1
(45) Date of Patent: *Dec. 11, 2001

(54) INTEGRATED SELF ALIGNED CONTACT ETCH

(75) Inventors: Raymond Hung, San Jose; Joseph Patrick Caulfield, Cupertino; Jian Ding, San Jose, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/112,095

(22) Filed: Jul. 9, 1998

(51) Int. Cl.[7] ............... H01L 21/302; H01L 21/3065
(52) U.S. Cl. .................. 438/706; 438/723; 438/724; 438/743; 438/744
(58) Field of Search ................... 438/706, 738, 438/724, 723, 743, 744

(56) References Cited

U.S. PATENT DOCUMENTS

| | | | |
|---|---|---|---|
| 5,219,793 | * 6/1993 | Cooper et al. | 438/67 |
| 5,269,879 | * 12/1993 | Rhoades et al. | 438/697 |
| 5,308,742 | * 5/1994 | Ta | 430/313 |
| 5,338,399 | * 8/1994 | Yanagida | 216/396 |
| 5,611,888 | 3/1997 | Bosch et al. | 156/643.1 |
| 5,627,103 | * 5/1997 | Li | 438/158 |
| 5,668,052 | 9/1997 | Matsumoto et al. | 438/624 |
| 5,786,276 | * 7/1998 | Brooks et al. | 438/724 |
| 5,869,404 | * 2/1999 | Kim et al. | 438/738 |
| 5,920,796 | * 7/1999 | Wang et al. | 438/700 |

OTHER PUBLICATIONS

Yukio Iijima et al., High Selective SiO2 Etch Employing Inductively Coupled Hydro–Fluorocarbon Plasma Chemistry for Self Aligned Contact Etch, Japanese Journal of Applied Physics, vol. 36, No. 9A, pp. 5498–5501, Sep. 1997.

Hideyuki Kazumi et al., "Model prediction of radical composition in C4F8 plasmas and collelation with measured etch characteristics of silicon dioxide," International Workshop On Plasma Sources and Surface Interactions in Materials Processing, Fuji–Yoshida, Japan, Sep. 20–22, 1995, vol. 5, No. 2, pp. 200–209, published May 1996.

Buckner et al., Organic Films as Anti–Reflective Coatings on Solar Cells, Solar Energy Materials, vol. 12, pp 131–136, 1985.*

* cited by examiner

Primary Examiner—Robert Kunemund
Assistant Examiner—Lynette T. Umez-Eronini
(74) Attorney, Agent, or Firm—Stallman and Pollock

(57) ABSTRACT

An integrated self aligned contact process includes oxide etch with high oxide etch rate, integrated selective oxide etch and nitride liner removal with high selectivity to corner nitride with the ability to remove the bottom nitride liner, and stripping of all polymer and photoresist. $C_4F_8$ and $CH_2F_2$ are used for the high selectivity oxide etch step. The unique behavior of $CH_2F_2$ in high density plasma allows polymer protection to form on the nitride corner/sidewall while at the same time etching the bottom nitride.

4 Claims, 3 Drawing Sheets

INTEGRATED SELF ALIGNED CONTACT ETCH

BACKGROUND OF THE INVENTION

1. Field of the Invention

The present invention relates to plasma etching in the fabrication of integrated circuit structures and, in particular, to an integrated plasma etch process module that includes a self aligned, selective oxide etch, nitride removal with high selectivity to corner nitride and stripping of all polymer and photoresist.

2. Description of the Related Art

Advanced integrated circuits include multiple conductive layers that are separated from a silicon substrate and from each other by intervening dielectric material. Contact or via holes are etched through the dielectric material and filled with a conductor to selectively provide electrical contacts or interconnects between the substrate and the various conductive layers.

While the dielectric layers in these integrated circuit structures can consist of a single layer of material, such as silicon oxide, more typically the dielectric layer includes an upper layer (e.g. silicon oxide) and a lower stop layer (e.g. silicon nitride with upper oxide). The stop layer has a composition relative to the upper layer such that a carefully chosen etch process that is selective to the material of the stop layer etches through the upper dielectric but stops on the stop layer, thus protecting the underlying material during the oxide etch. A further etch of the stop layer is then performed to expose the underlying material to complete the contact or via hole.

FIG. 1A shows an integrated circuit structure commonly utilized in dynamic random access memory (DRAM) devices. The illustrated structure includes a silicon substrate 10 and two polysilicon gate electrodes 12. The gate electrodes 12 are electrically insulated by surrounding silicon dioxide 14 which also separates the gate electrodes 12 from the underlying substrate 10. A silicon nitride liner 16 is formed over the gate oxide 14 and exposed surfaces of the substrate 10 between the gate electrodes 12. An intermediate silicon oxide layer 18 is formed over the nitride liner 16.

Referring to FIG. 1B, as part of the DRAM circuit fabrication, electrical contact is made with the substrate 10 between the gate electrodes 12. To achieve this, a photoresist (PR) mask 20 having an opening 22 is provided on the intermediate oxide layer 18 to facilitate the etching of a contact hole through the oxide 18 and the nitride liner 16 to the substrate 10. However, as shown in FIG. 1B by dashed lines, limitations on existing photolithography techniques can cause misalignment of the mask 20 such that the etch opening 22 is formed partially over the gate oxide 14. As a result, as shown in FIG. 1C, if the selectivity of the oxide etch chemistry to nitride is too low, etching of the intermediate oxide 18 can result in removal of liner nitride 16 on the sidewalls 24, and particularly on the shoulders 26 of the gate oxide. Etch-through of the nitride liner 16 at these points exposes the gate oxide 14 to the oxide etch environment, potentially resulting in shorts between the contact and the gate electrode 12.

Thus, the selectivity of the oxide etch to nitride both at the relatively open floor of the contact hole and at the shoulders 26 of the hole is particularly crucial.

One widely utilized technology for oxide etching is the use of a fluorinated chemical etchant. During the oxide etch step, a fluorine-containing polymer is formed as a passivation material and functions as an etch stop to cover the underlying nitride, thereby increasing the oxide etch selectivity dramatically. Following oxide etching, the pattern-defining photoresist and the fluorine-containing polymer are removed.

While increased selectivity can be achieved using a highly polymerizing etch chemistry, the extensive polymerization may cause etch stop, particularly in high density DRAM devices in which the distance between gate electrodes is very small. Etch stop occurs when the sidewalls of the etched hole become so heavily polymerized that the polymer closes the hole and prevents further etching at the bottom of the hole. As a result, the process window for a self-aligned dielectric etch is often limited by the conflicting requirements of the oxide etch to maintain the nitride liner while continuing to open the oxide in the hole.

Furthermore, during stripping of the photoresist and the fluorine-containing polymer, free fluorine radicals are released into the plasma from the dissociation of the polymer residue. The photoresist stripping plasma, now including free fluorine released from the polymer residue, can deleteriously effect the device structure.

Therefore, any etch chemistry or parameters that provide high selectivity and large etch stopping margin are particularly attractive in oxide etching.

SUMMARY OF THE INVENTION

The present invention provides an integrated self-aligned contact etch process. The process steps include oxide etch with high oxide etch rate, integrated selective oxide etch and nitride liner removal with high selectivity to corner nitride and the ability to remove the bottom nitride liner, and stripping of all polymer and photoresist. $C_4F_8$ and $CH_2F_2$ are used for the high selectivity oxide etch step. The unique behavior of $CH_2F_2$ in high density plasma allows polymer protection to form on the nitride corner/sidewall and, at the same time, to etch the bottom nitride.

The foregoing aspects of the present invention will become more readily appreciated and better understood by reference to the following detailed description which should be considered in conjunction with the accompanying drawings.

DETAILED DESCRIPTION OF THE INVENTION

An integrated self aligned contact etch process in accordance with the present invention will now be described in the context of the fabrication of a dynamic random access memory (DRAM) circuit structure. However, description of the invention in this context should be considered illustrative and not limiting. Those skilled in the art will appreciate that methods in accordance with the present invention have application in the fabrication of a wide variety of integrated circuit structures.

Figure 1A:
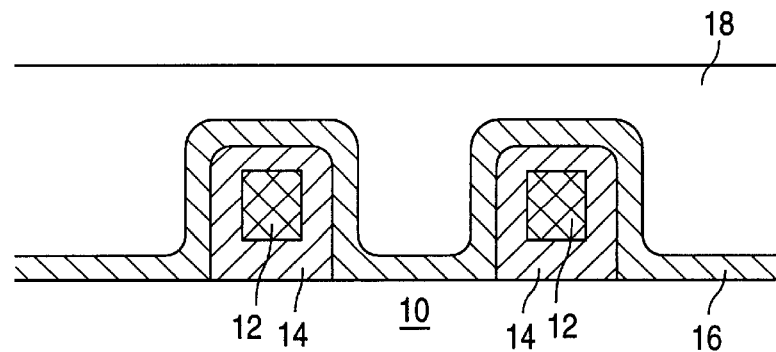
FIGS. 1A–1C are cross-section drawings illustrating potential mask misalignment in contact hole etch process.
Figure 1B:
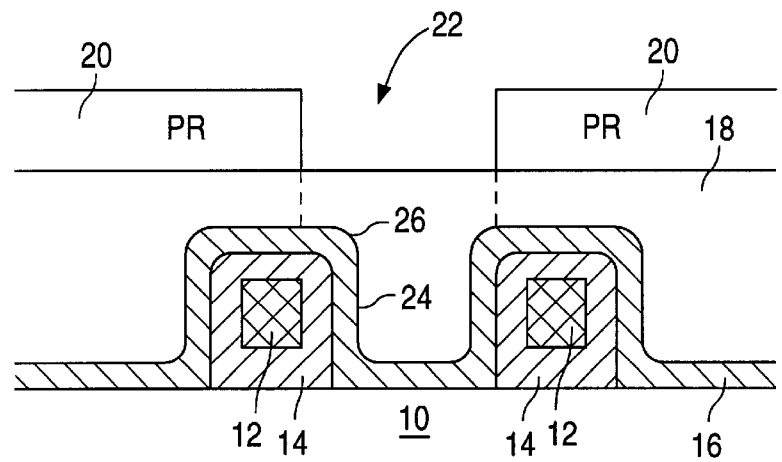
Figure 1C:
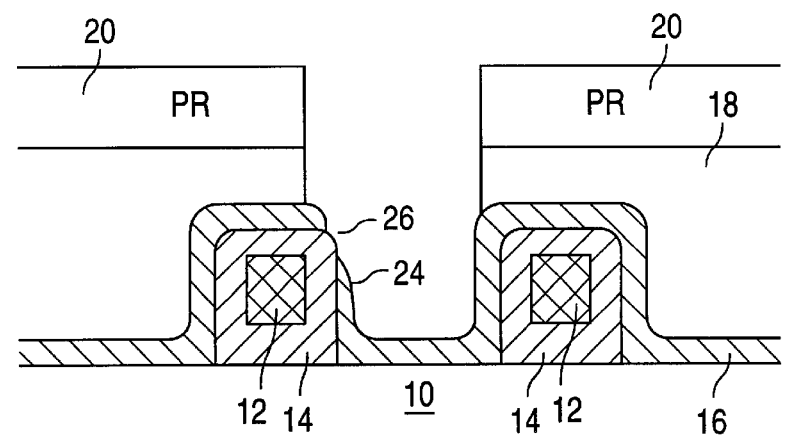
Figure 2A:
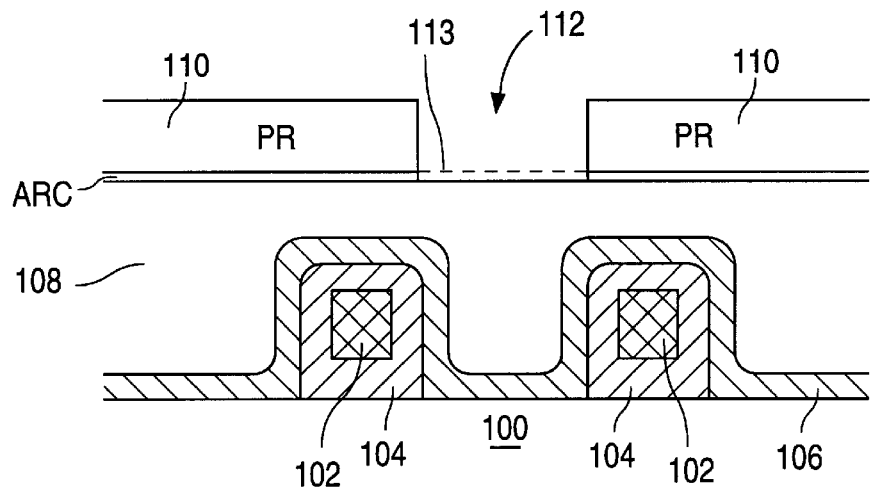
FIGS. 2A–2C are cross-section drawings illustrating an integrated self aligned contact etch process in accordance with the present invention.

FIG. 2A shows a portion of a DRAM structure that includes a silicon substrate 100 and two polysilicon gate electrodes 102. The gate electrodes are insulated by surrounding silicon dioxide 104 which also separates the gate electrodes 102 from the underlying substrate 100. A silicon nitride liner 106 is formed over the gate oxide 104 and on exposed surface regions at the substrate 100 between the gate electrodes 102. An intermediate silicon oxide layer 108 is formed over the nitride 106, a photoresist mask 110 having an opening 112 is formed on the intermediate oxide 108. FIG. 2A shows an bottom anti-reflective coating (BARC) 113 formed on the surface of the intermediate oxide 108; utilization of BARC 113 enhances mask definition in the fabrication of high density integrated circuits.

Figure 2B:
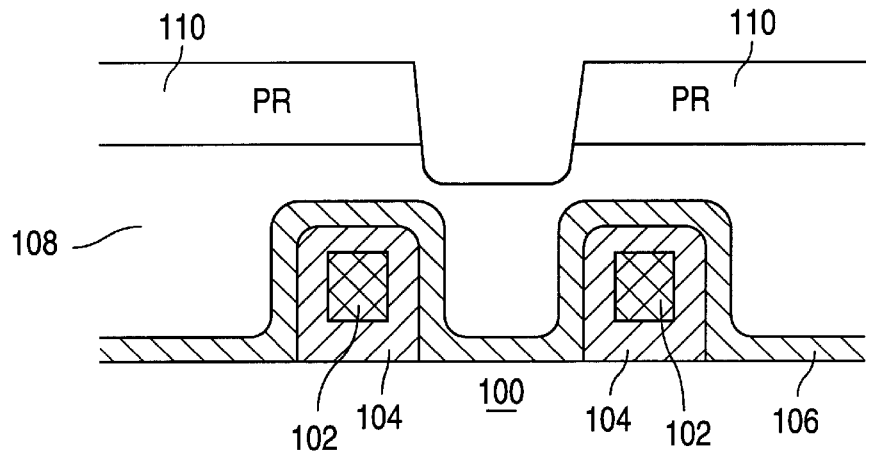

As shown in FIG. 2B, a process sequence in accordance with the present invention begins with the removal of the BARC organic layer 113, which in the disclosed embodiment is approximately 900 Å thick, before etching of the intermediate oxide layer 108 can begin. $CHF_3$, Ar and $O_2$ are used as the main etching chemistry for removal of the BARC 113. Loss of photoresist material from the mask 110 is minimal during this BARC removal step, typically about 0.1 $\mu$m.

An initial oxide etch step then proceeds using $C_4F_8$ and Ar. The etch rate is approximately 8500 Å per minute. The total etch time is 30 seconds and the target etch depth is 4300 Å, about one-half of the total thickness of the intermediate oxide 108 in this illustrative embodiment. Those skilled in the art will appreciate that the thickness of oxide material removed in this initial etch step may vary depending upon circuit design and application. An important feature of the initial oxide etch step is that it etch the intermediate oxide 108 only to a depth that remains above the nitride liner material 106 that overlies the gate oxide 104 over the gate electrode 102.

Figure 2C:
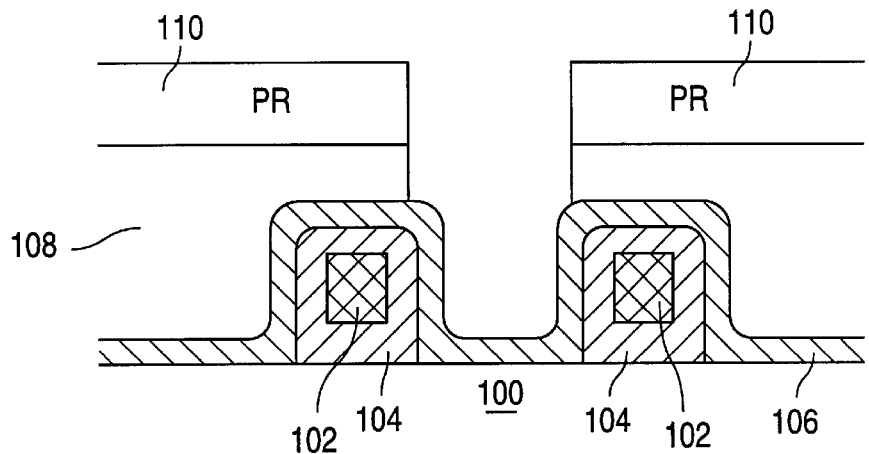

Next, an integrated selective oxide etch and nitride liner removal step is performed to complete the etch through the remainder of the intermediate oxide 108 and through the nitride liner material 106, thus exposing the underlying substrate 100. $C_4F_8$ and $CH_2F_2$ are used as the main etching gases in this step and Argon is used as a carrier gas. The resulting structure is shown in FIG. 2C.

While $C_4F_8$ alone would have good selectivity to flat nitride, it does not form enough polymer to protect the nitride corner and sidewall. Therefore, the corner or sidewall nitride loss slows but does not stop as the etch proceeds. As a result, process performance is sensitive to the amount of over-etch. In a self aligned contact etch, long over-etch is usually needed to accommodate the variations in subsequent chemical mechanical polishing (CMP) uniformity, which is typically 15% and can be as large of 50%. Experiments performed with a $CHF_3$ and $CH_2F_2$ mixture on self aligned contact structures showed clearly that $CH_2F_2$ played a very important role on sidewall polymer formation.

The process described above can be performed in an inductively coupled high density plasma etch reactor such as the IPS (inductive plasma source) oxide etch reactor available from Applied Materials, Inc., Santa Clara, Calif. and described by Collins, et al. in U.S. patent application Ser. No. 08/733,544, filed Oct. 21, 1996.

Figure 3:
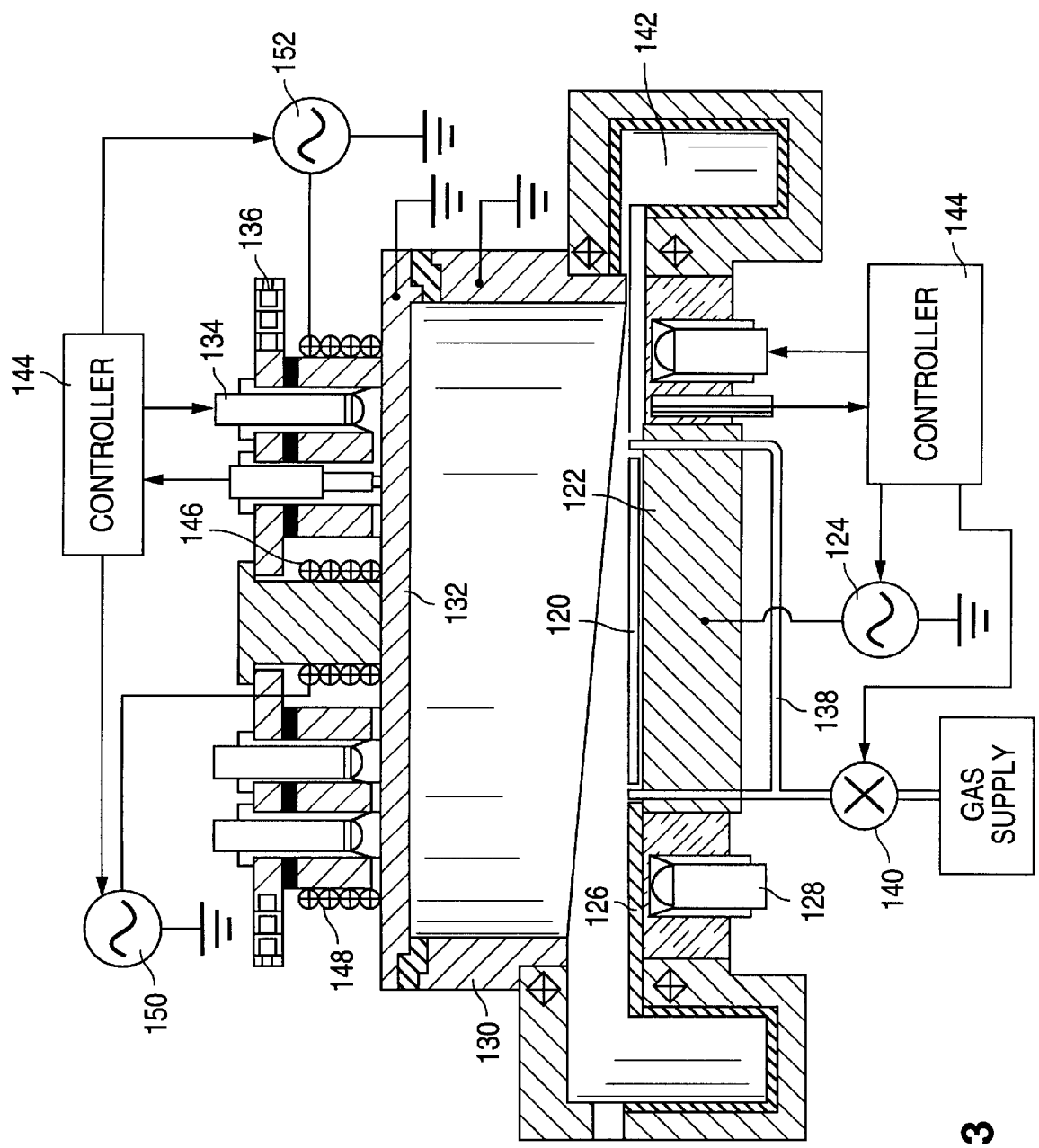
FIG. 3 is a schematic drawing, partially in cross-section view, illustrating an indirectly coupled high-density plasma reactor in which a process in accordance with the present invention may be practiced.

The general IPS reactor structure and some auxiliary equipment are illustrated in partial cross-section in FIG. 3.

As shown in FIG. 3, a wafer 120 to be processed is supported on a cathode pedestal 122, which is supplied with RF power from a first RF power supply 124. A silicon ring 126 surrounds the pedestal 122 and is controllably heated by an array of heater lamps 128. A grounded silicon wall 130 surrounds the plasma processing area. A silicon roof 132 overlies the plasma processing area, and lamps 134 and water cooling channels 136 control its temperature. The temperature-controlled silicon ring 126, and to a lesser extent the silicon roof 132, can be used to scavenge fluorine from the fluorocarbon or other fluorine-based plasma. Processing gases are supplied from one or more bottom gas feeds 138 through a bank of mass flow controllers 140. Alternatively, a top gas feed may be formed as a small shower head in the center of the silicon roof 132. An unillustrated vacuum pumping system connected to a pumping channel 142 around the lower portion of the chamber maintains the chamber at a preselected pressure. The system controller 144 controls the operation of the reactor and its auxiliary equipment.

In the illustrated configuration, the silicon roof 132 is grounded, but it's semiconductor resistivity and thickness are chosen to pass generally axial RF magnetic fields produced by an inner inductive coil stack 146 and an outer inductive coil stack 148 powered by respective RF power supplies 150, 152. Alternatively, a single RF power supply may be used in conjunction with a selectable power splitter.

The system controller 144 controls the mass flow controllers 138, the heater lamps 128, 134, the supply of chilled water to the cooling channels 136, the throttle valve to the vacuum pumps, and the power supplies 124, 150, and 152. All these regulated functions control the etching chemistry in conformance to a process recipe of the sort described above. The process recipe is stored in the controller 144 and magnetic optical or semiconductor memory, as is well known in the art, and the controller 144 reads the recipe from a recording medium inserted into it. It is typical for the equipment supplier to provide recipes and magnetic medium such as floppy or optical media such as CD ROMS which are then read into controller 144.

A principle advantage of the inductively coupled plasma reactor illustrated in FIG. 3 is that different amounts of power can be supplied to the inductive coils 146, 148 and to the capacitive pedestal 122. The inductive power creates a plasma source region and large part remote from the wafer 120 while the capacitive power controls plasma sheath adjacent to the wafer 120 and thus determines the DC bias across the sheath at the wafer 120. The source power can be raised to increase the etching rate and control the number and type of excited radicals while the bias power can be varied to have ions accelerated across the plasma sheath to either high or low energy in which then strike the wafer 120 with the selected energy.

As will be understood by those skilled in the art, the foregoing description of the present invention is an illustration of the invention rather than a limitation thereon. It is intended that various modifications and similar methods be included within the spirit and scope of the invention.

What is claimed is:

1. An integrated self-aligned contact etch method for etching a contact hole in an integrated circuit structure that includes spaced-apart gate electrodes surrounded by dielectric material to electrically insulate the gate electrodes and to separate the gate electrodes from an underlying semiconductor substrate, a layer of silicon nitride liner material formed over the dielectric material and a surface region of the semiconductor substrate between the gate electrodes, and a layer of silicon oxide formed on the silicon nitride liner material, the method comprising:

forming a photoresist mask on the silicon oxide layer, the mask having an opening formed over the substrate surface region;

performing a first etch step that etches the silicon oxide layer through the mask opening to remove a first portion of the total thickness of the silicon oxide layer using a first etch gas mixture that includes $C_4F_8$ and Argon;

following the first etch step, performing a second etch step that etches the remainder of the silicon oxide layer and the nitride liner material through the mask opening using a second etch gas mixture that is different from the first etch gas mixture, and that includes $C_4F_8$ and $CH_2F_2$, to expose the substrate surface region; and removing the photoresist mask.

2. An integrated self-aligned etch method for etching a hole in an integrated circuit structure that includes dielectric material formed overlying a semiconductor substrate, a layer of nitride liner material formed over the dielectric material and a surface region of the semiconductor substrate, a layer of silicon oxide formed on the silicon nitride liner, a layer of bottom anti-reflective coating (BARC) formed on the silicon oxide layer, and a photoresist mask formed on the BARC layer, the photoresist mask having an opening formed over the substrate surface region, the method comprising:

etching the BARC layer through the mask opening to expose the silicon oxide layer;

performing a first etch step that etches the silicon oxide layer through the mask opening to remove a first portion of the total thickness of the silicon oxide layer using a first etch gas mixture that includes $C_4F_8$ and Argon;

following the first etch step, performing a second etch step that etches the remainder of the silicon oxide layer and the nitride liner through the mask opening using a second etch gas mixture that is different from the first etch gas mixture, and that includes $C_4F_8$ and $CH_2F_2$, to expose the substrate surface region; and removing the photoresist mask.

3. An integrated self-aligned contact etch method for etching a contact hole in an integrated circuit structure that includes at least two spaced-apart conductive gate electrodes surrounded by dielectric material to electrically insulate the gate electrodes and to separate the gate electrodes from an underlying semiconductor substrate, a layer of silicon nitride liner material formed over the dielectric material and a surface region of the semiconductor substrate between the gate electrodes, and a layer of silicon oxide formed on the silicon nitride liner material, the method comprising:

forming a photoresist mask on the silicon oxide layer, the photoresist mask having an opening formed over the substrate region;

performing a first etch step to etch the silicon oxide layer through the mask opening to remove a first portion of the total thickness of the silicon oxide layer using a first gas mixture that includes $C_4F_8$ and Argon and such that the silicon oxide layer is etched only to a depth that remains above the nitride liner material that overlies the gate oxide over the gate electrodes;

subsequent to the first etch step, performing a second etch step to etch the remainder of the silicon oxide layer and the nitride liner material through the mask opening using a second gas mixture that is different from the first etch gas mixture, and that includes $C_4F_8$ and $CH_2F_2$, to expose the substrate surface region; and removing the photoresist mask.

4. An integrated self-aligned etch method for etching a hole in an integrated circuit structure that includes dielectric material formed overlying a semiconductor substrate, a layer of silicon nitride liner material formed over the dielectric material and a surface region of the semiconductor substrate, layer of silicon oxide formed on the silicon nitride liner, a layer of bottom anti-reflective coating (BARC) formed on the silicon oxide layer and a photoresist mask, formed on the BARC layer, the mask having an opening formed over the substrate surface region, the method comprising:

etching the BARC layer through the mask opening using a BARC etch gas mixture that includes $CHF_3$;

performing a first etch step that etches the silicon oxide layer through the mask opening to remove a first portion of the total thickness of the silicon oxide layer using a first etch gas mixture that includes $C_4F_4$ and Argon;

following the first etch step, performing a second etch step that etches the remainder of the silicon oxide layer and the nitride liner through the mask opening using a second gas mixture that is different from the first etch gas mixture, and that includes $C_4F_8$ and $CH_2F_2$, to expose the substrate surface region; and removing the photoresist mask.

* * * * *

UNITED STATES PATENT AND TRADEMARK OFFICE
CERTIFICATE OF CORRECTION

PATENT NO.   : 6,329,292 B1
DATED        : December 11, 2001
INVENTOR(S)  : Hung et al.

It is certified that error appears in the above-identified patent and that said Letters Patent is hereby corrected as shown below:

Column 6,
Line 35, please replace "C4F4" with -- C4F8 --.

Signed and Sealed this

Twenty-third Day of April, 2002

Attest:

JAMES E. ROGAN
Attesting Officer    Director of the United States Patent and Trademark Office